(12) United States Patent
Liang et al.

(10) Patent No.: US 11,688,698 B2
(45) Date of Patent: Jun. 27, 2023

(54) TRENCH INSULATED GATE BIPOLAR TRANSISTOR PACKAGING STRUCTURE AND METHOD FOR MANUFACTURING THE TRENCH INSULATED GATE BIPOLAR TRANSISTOR

(71) Applicant: Gree Electric Appliances, Inc. of Zhuhai, Guangdong (CN)

(72) Inventors: Saichang Liang, Guangdong (CN); Yingjiang Ma, Guangdong (CN); Bo Shi, Guangdong (CN); Wei Jiang, Guangdong (CN)

(73) Assignee: Gree Electric Appliances, Inc. of Zhuhai, Zhuhai (CN)

( * ) Notice: Subject to any disclaimer, the term of this patent is extended or adjusted under 35 U.S.C. 154(b) by 0 days.

(21) Appl. No.: 16/973,304

(22) PCT Filed: Aug. 2, 2019

(86) PCT No.: PCT/CN2019/099084
§ 371 (c)(1),
(2) Date: Dec. 8, 2020

(87) PCT Pub. No.: WO2020/029884
PCT Pub. Date: Feb. 13, 2020

(65) Prior Publication Data
US 2021/0249362 A1 Aug. 12, 2021

(30) Foreign Application Priority Data

Aug. 6, 2018 (CN) .......................... 201810884478.3

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4825* (2013.01); *H01L 21/565* (2013.01);
(Continued)

(58) Field of Classification Search
CPC ............... H01L 23/562; H01L 23/3114; H01L 23/49513; H01L 23/4952; H01L 23/49562;
(Continued)

(56) References Cited

U.S. PATENT DOCUMENTS

2005/0077617 A1* 4/2005 Hirano .................... H01L 24/83
257/E23.092
2007/0296077 A1* 12/2007 Moline ................... H01L 23/66
257/796

(Continued)

FOREIGN PATENT DOCUMENTS

| CN | 103779340 A | 5/2014 |
|---|---|---|
| CN | 203733785 U | 7/2014 |

(Continued)

OTHER PUBLICATIONS

International Search Report, dated Nov. 4, 2019, in International application No. PCT/CN2019/099084, filed on Aug. 2, 2019.

*Primary Examiner* — Marc Anthony Armand
(74) *Attorney, Agent, or Firm* — McAndrews, Held & Malloy, Ltd.

(57) ABSTRACT

The present disclosure discloses a trench Insulated Gate Bipolar Transistor (IGBT) packaging structure and a method for manufacturing the trench Insulated Gate Bipolar Transistor packaging structure. The trench IGBT packaging structure includes: a trench IGBT, which includes an emitting electrode metal layer, and a trench gate electrode; a lead frame, which includes a chip placement area and an emitting electrode lead-out end; a first bonding wire connecting the
(Continued)

emitting electrode metal layer and an emitting electrode pin. One end of the first bonding wire is connected to a surface, away from the trench gate electrode, of the emitting electrode metal layer to form a strip-shaped first solder joint, the other end is connected to the emitting electrode lead-out end to form a second solder joint, and an extension direction of the first solder joint is perpendicular to an extension direction of the trench of the trench gate electrode.

10 Claims, 3 Drawing Sheets

(51) Int. Cl.
  *H01L 21/56* (2006.01)
  *H01L 23/31* (2006.01)
  *H01L 23/495* (2006.01)

(52) U.S. Cl.
  CPC ...... *H01L 23/3114* (2013.01); *H01L 23/4952* (2013.01); *H01L 23/49513* (2013.01); *H01L 23/49562* (2013.01); *H01L 24/48* (2013.01); *H01L 24/73* (2013.01); *H01L 24/85* (2013.01); *H01L 2224/48245* (2013.01); *H01L 2224/73265* (2013.01); *H01L 2224/85205* (2013.01); *H01L 2924/10253* (2013.01); *H01L 2924/13055* (2013.01); *H01L 2924/351* (2013.01); *H01L 2924/37001* (2013.01)

(58) Field of Classification Search
  CPC ... H01L 21/4825; H01L 21/565; H01L 24/48; H01L 24/73; H01L 24/85; H01L 224/48245; H01L 224/73265; H01L 224/85205
  See application file for complete search history.

(56) References Cited

U.S. PATENT DOCUMENTS

| | | | |
|---|---|---|---|
| 2013/0049137 A1* | 2/2013 | Uno | H01L 27/088 257/E27.06 |
| 2014/0299979 A1* | 10/2014 | Danno | H01L 24/97 438/107 |
| 2015/0243589 A1 | 8/2015 | Ho et al. | |
| 2019/0356277 A1* | 11/2019 | Bouisse | H01L 23/66 |
| 2020/0227521 A1* | 7/2020 | Sakamoto | H01L 29/7397 |

FOREIGN PATENT DOCUMENTS

| | | |
|---|---|---|
| CN | 106298722 A | 1/2017 |
| CN | 107492543 A | 12/2017 |
| CN | 208422903 U | 1/2019 |

* cited by examiner

TRENCH INSULATED GATE BIPOLAR TRANSISTOR PACKAGING STRUCTURE AND METHOD FOR MANUFACTURING THE TRENCH INSULATED GATE BIPOLAR TRANSISTOR

CROSS REFERENCE TO RELATED APPLICATIONS

This application is a 371 of International Patent Application No. PCT/CN2019/099084, filed Aug. 2, 2019, which claims benefit of Chinese Patent Application No. 20180884478.3, filed to the China Patent Office on, entitled "Trench Insulated-Gate Bipolar Transistor Packaging Structure and Manufacturing Method Therefor," contents of both of which are hereby incorporated by reference in their entirety.

TECHNICAL FIELD

The disclosure relates to the field of transistor packaging technology, in particular to a trench Insulated Gate Bipolar Transistor (IGBT) packaging structure and a method for manufacturing the trench insulated gate bipolar transistor packaging structure.

BACKGROUND

An Insulated Gate Bipolar Transistor (IGBT) is mainly used in an Alternating Current (AC) motor of a variable frequency air conditioner, a frequency converter, a switching power supply, a lighting circuit, traction drive and other fields. Because the IGBT is actually a circuit switch, used for a strong current with hundreds to thousands of volts and tens to hundreds of amperes, so the requirement for its reliability level is much higher than the general consumer electronic products.

The IGBT technology includes two types: planar structure and trench structure. The trench structure is a new technology, which improves a unit density of a unit without affecting any other electrical characteristics, and thus greatly improves a conduction loss Therefore, compared with a planar IGBT, a trench IGBT is thinner, and has a higher current density and a lower cost.

However, in the process of reliable performance verification, the trench IGBT is prone to chip burning due to the rapid increase of leakage current, which is mainly caused by weak links in the manufacturing process of the surface of the chip or in a certain area of the chip. The reliable performance of the trench IGBT is optimized in the following ways: first, improving by means of a chip structure; and second, improving through a packaging phase. However, in the overall design of an IGBT, if specific parameters of a chip have been confirmed, it is almost impossible to improve the reliability of the chip by taping out again (because a period of taping out is long and the cost is high). In view of this, the fastest, cheapest and most effective way is to improve the reliable performance of the whole device through the packaging of chip.

At present, there is no mature packaging technology for a thin trench IGBT in China. For the wire bonding process, the reliability of a bonding wire is improved by coordinating only power, strength and time of the pressure wire bonding process. A first solder joint connecting the bonding wire and a chip is not controlled, which makes the number of trenches below the first solder joint extremely small, thereby resulting in the damage of a small number of trenches under high compressive stress during welding.

SUMMARY

The disclosure provides the following technical solution.

A trench IGBT packaging structure is provided, which includes: a trench IGBT, a lead frame, and a first bonding wire.

The trench IGBT includes an emitting electrode, an emitting electrode metal layer electrically connected to the emitting electrode, and a trench gate electrode arranged on one side of the emitting electrode metal layer.

The lead frame includes an emitting electrode lead-out end and a chip placement area configured to fix the trench IGBT.

The first bonding wire connects the emitting electrode metal layer and the emitting electrode lead-out end. One end of the first bonding wire is connected to a surface, away from the trench gate electrode, of the emitting electrode metal layer to form a strip-shaped first solder joint, the other end of the first bonding wire is connected to the emitting electrode lead-out end to form a second solder joint, and an extension direction of the first solder joint is perpendicular to an extension direction of a trench of the trench gate electrode.

Optionally, a part, between the first solder joint and the second solder joint, of the first bonding wire forms a curved portion, and a height from a highest point of the curved portion to the emitting electrode metal layer is 750 microns to 1000 microns.

Optionally, the emitting electrode lead-out end comprises a first wire pad which is connected with the first bonding wire, and the second solder joint is formed on the first wire pad.

Optionally, at least one first bonding wire is connected between the emitting electrode metal layer and the first wire pad.

Optionally, the lead frame further includes a gate electrode lead-out end, and the trench gate electrode is electrically connected with the gate electrode lead-out end through a second bonding wire.

Optionally, the trench IGBT includes a silicon substrate, the trench gate electrode formed on the silicon substrate, a silicon oxide insulating layer formed on a surface of one side, away from the silicon substrate, of the trench gate electrode, and the emitting electrode metal layer formed on one side, away from the silicon substrate, of the silicon oxide insulating layer.

Optionally, the trench IGBT further includes a collecting electrode on one side, far away from the trench gate electrode, of the silicon substrate, the lead frame further includes a collecting electrode lead-out end, and the collecting electrode is electrically and physically connected with the chip placement area of the lead frame by a binding material.

Optionally, the trench IGBT further includes a plastic packaging housing, the plastic packaging housing is formed by a plastic packaging process, and an interior of the plastic packaging housing is fully filled.

Optionally, the trench IGBT includes a substrate, the trench gate electrode, a silicon oxide insulating layer and the emitting electrode metal layer, the trench gate electrode is formed on the substrate, the silicon oxide insulating layer is formed on one side, away from the substrate, of the trench gate electrode, and the emitting electrode metal layer is formed on one side, away from the substrate, of the silicon oxide insulating layer.

Optionally, the collecting electrode lead-out end is connected with the chip placement area.

The disclosure also provides a method for manufacturing the trench IGBT packaging structure provided in any above technical solution, which includes the following steps:

a trench IGBT is fixed to a chip placement area of a lead frame;

an ultrasonic soldering cleaver is used to perform pressure welding, so as to connect one end of the first bonding wire with an emitting electrode metal layer of the trench IGBT and form a strip-shaped first solder joint, an extension direction of which is perpendicular to an extension direction of a trench of a trench gate electrode.

the ultrasonic soldering cleaver is vertically raised and kept for a preset time, so that the first bonding wire generates an arc height with a set height.

the ultrasonic soldering cleaver is moved to an emitting electrode lead-out end of the lead frame to perform pressure welding, so as to connect the other end of the first bonding wire with the emitting electrode lead-out end and form a second solder joint.

Optionally, the preset time is 1 millisecond to 10 milliseconds.

Optionally, the arc height with the set height of the first bonding wire is 750 microns to 1000 microns.

Optionally, after the trench IGBT is electrically connected with a corresponding pin on the lead frame, a plastic packaging material is used to fill a combining device of the trench IGBT and the lead frame, so as to form a plastic packaging housing an interior of which is fully filled.

The disclosure also provides a method for manufacturing a trench IGBT packaging structure, which includes the following steps: a lead frame with a chip placement area is provided, and a trench IGBT is fixed to the chip placement area, the trench IGBT including an emitting electrode, an emitting electrode metal layer electrically connected with the emitting electrode, and a trench gate electrode arranged on one side of the emitting electrode metal layer, and the trench gate electrode is provided with an extending trench;

one end of a first bonding wire is soldered with the emitting electrode metal layer, so as to form a strip-shaped first solder joint on a surface, away from the trench gate electrode, of the emitting electrode metal layer, an extension direction of the first solder joint is perpendicular to an extension direction of the trench of the trench gate electrode;

the other end of the first bonding wire is soldered with an emitting electrode lead-out end to form a second solder joint.

Optionally, an ultrasonic soldering cleaver is used to perform pressure welding to one end of the first bonding wire and the emitting electrode metal layer.

Optionally, after the first solder joint is formed, the ultrasonic soldering cleaver is vertically raised and kept for a preset time, so that the first bonding wire generates an arc height with a set height.

Optionally, the preset time is 1 millisecond to 10 milliseconds.

Optionally, the arc height with the set height is 750 microns to 1000 microns.

Optionally, the lead frame further includes the gate electrode lead-out end. The manufacturing method further includes that: the trench gate electrode is electrically connected with the gate electrode lead-out end by a second bonding wire.

Optionally, the trench IGBT further includes a substrate and an insulating layer. The trench gate electrode is formed on the substrate, the insulating layer is formed on a surface of one side, away from the substrate, of the trench gate electrode, and the emitting electrode metal layer is formed on one side, away from the substrate, of the insulating layer.

Optionally, the trench IGBT further includes a collecting electrode on one side, far away from the trench gate electrode, of the silicon substrate, and the lead frame further includes a collecting electrode lead-out end. The collecting electrode is electrically and physically connected with the chip placement area of the lead frame by a binding material, and the collecting electrode lead-out end is connected with the chip placement area.

Optionally, the trench IGBT and the lead frame form a combining device, and after the trench IGBT is connected with the emitting electrode lead-out end, the gate electrode lead-out end and the collecting electrode lead-out end, the combining device is filled with a plastic packaging material, so as to form the plastic packaging housing an interior of which is fully filled.

BRIEF DESCRIPTION OF THE DRAWINGS

The accompanying drawings constituting a part of the present disclosure are used for providing further understanding of the disclosure. Schematic embodiments of the disclosure and description thereof are used for illustrating the disclosure and not intended to form an improper limit to the disclosure. In the accompanying drawings.

The above accompanying drawings include the following reference numbers:

1. Trench IGBT; 11. Silicon substrate; 12. Trench gate electrode; 13. Silicon oxide insulating layer; 14. Emitting electrode metal layer; 2. Lead frame; 21. Chip placement area; 22. First wire pad; 23. Second wire pad; 24. Collecting electrode lead-out end; 3. First bonding wire; 31. First solder joint; 32. Second solder joint; 33. Curved portion; and 4. Binding material.

DETAILED DESCRIPTION OF THE EMBODIMENTS

It is to be noted that the embodiments in the disclosure and characteristics in the embodiments may be combined without conflicts. The disclosure is elaborated below with reference to the accompanying drawings and embodiments.

In order to make those skilled in the art understand the solutions of the disclosure better, the technical solutions in the embodiments of the disclosure are clearly and completely elaborated below in combination with the accompanying drawings. It is apparent that the described embodiments are only a part of the embodiments of the disclosure but not all. Based on the embodiments of the disclosure, all the other embodiments obtained by those of ordinary skill in the art on the premise of not contributing creative effort should belong to the protection scope of the disclosure.

Figure 1:
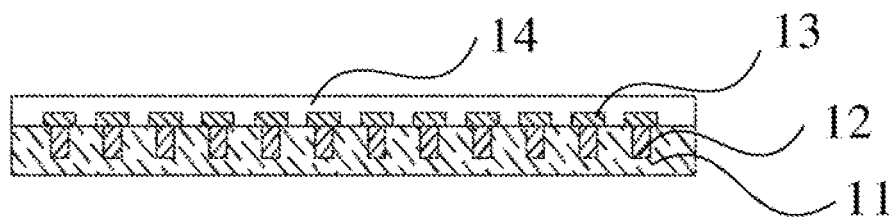
FIG. 1 is a structure diagram of a trench IGBT provided by the embodiments of the disclosure.
Figure 2:
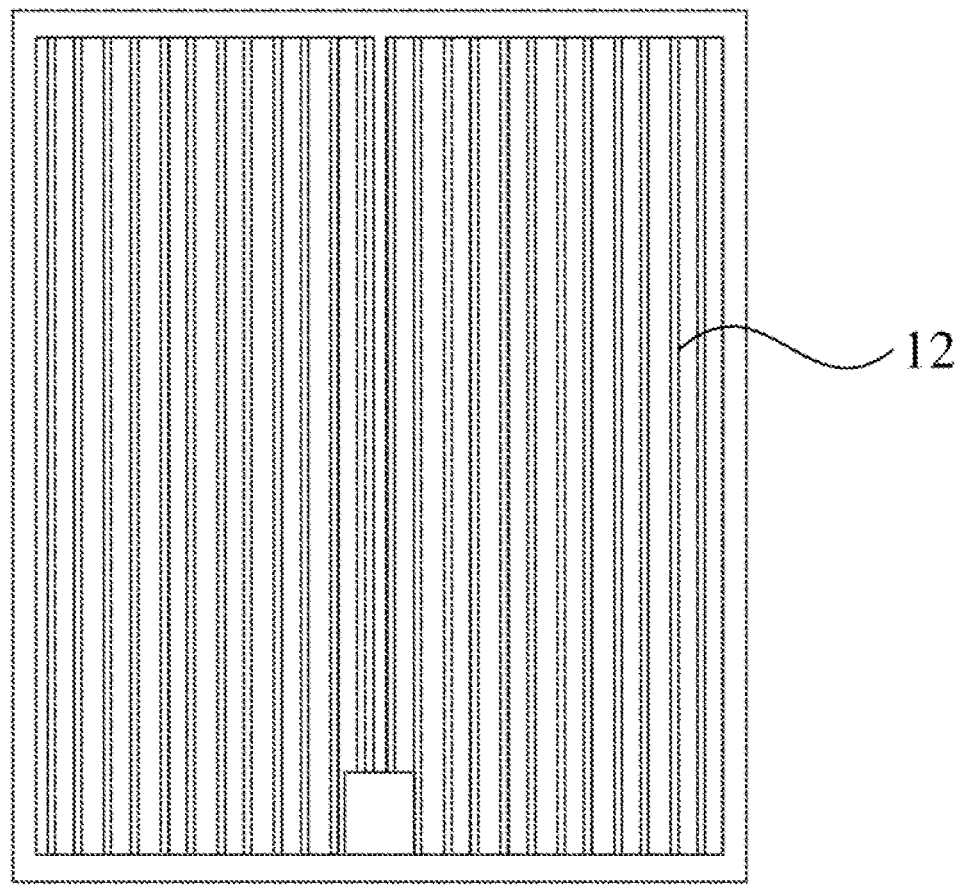
FIG. 2 is a structure diagram of a trench gate electrode provided by the embodiments of the disclosure.
Figure 3:
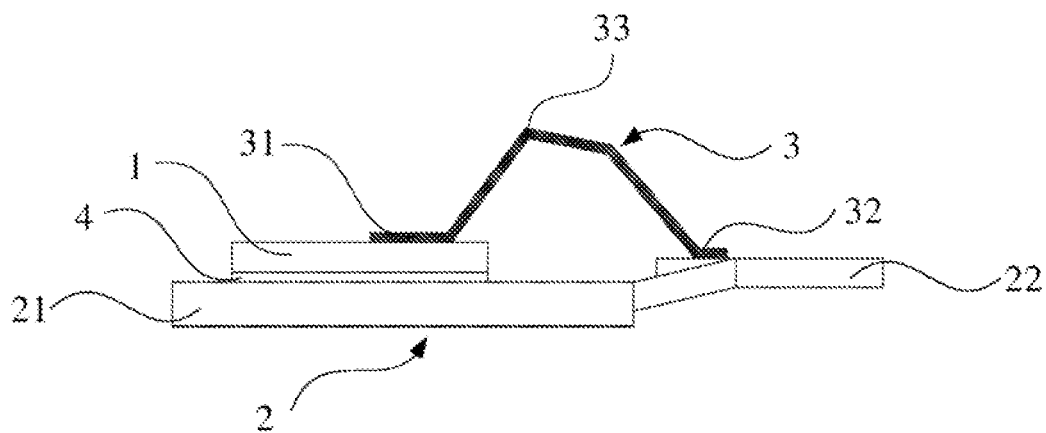
FIG. 3 is a structure diagram of a trench IGBT packaging structure provided by the embodiments of the disclosure.

Referring to FIG. 1 to FIG. 3, the disclosure provides a trench IGBT packaging structure, which includes: a trench IGBT 1, a lead frame 2, and a first bonding wire 3.

The trench IGBT 1 includes an emitting electrode, an emitting electrode metal layer 14 electrically connected to the emitting electrode, and a trench gate electrode 12 arranged on one side of the emitting electrode metal layer 14.

The lead frame 2 includes a chip placement area 21 configured to fix the trench IGBT 1 and an emitting electrode lead-out end.

The first bonding wire 3 connects the emitting electrode metal layer 14 and the emitting electrode lead-out end. One end of the first bonding wire 3 is connected to a surface, away from the trench gate electrode 12, of the emitting electrode metal layer 14 to form a strip-shaped first solder joint 31, the other end of the first bonding wire 3 is connected to the emitting electrode lead-out end to form a second solder joint 32, and an extension direction of the first solder joint 31 is perpendicular to an extension direction of a trench of the trench gate electrode 12.

The trench IGBT packaging structure provided in the embodiments of the disclosure includes the trench IGBT 1, the lead frame 2 and the first bonding wire 3 electrically connecting the trench IGBT with the lead frame. The trench IGBT 1 includes the emitting electrode metal layer 14 electrically connected to the emitting electrode, and the trench gate electrode 12 arranged on one side of the emitting electrode metal layer 14. The lead frame 2 includes the chip placement area 21 configured to fix the trench IGBT 1 and the emitting electrode lead-out end. The trench IGBT 1 is fixed to the chip placement area 21, and electrically connects the emitting electrode metal layer 14 with the emitting electrode lead-out end by bonding wire 3. The extension direction of the strip-shaped first solder joint 31, where the first bonding wire 3 is connected with the emitting electrode metal layer 14, is perpendicular to the extension direction of the trench of the trench gate electrode 12. Because the extension direction of the strip-shaped first solder joint 31 is perpendicular to the extension direction of the trench of the trench gate electrode 12, the first solder joint 31 can press more the trenches of the trench gate electrode, and the more the trenches of the trench gate electrode share the pressure on the first solder joint 31; in this way, the stress of a single trench is reduced, the damage to the chip during soldering is prevented, the bonding wire yield is improved, and then the reliability of the whole chip is improved.

In some embodiments of the disclosure, specifically, as shown in FIG. 3, a part, between the first solder joint 31 and the second solder joint 32, of the first bonding wire 3 forms a curved portion 33, and an arc height from the highest point of the curved portion 33 to the emitting electrode metal layer 14 is 750 microns to 1000 microns. The arc height of the curved portion 33 is greater than the arc height of the conventional bonding wire, which makes the pressure of the bonding wire evenly distributed in more the trenches of the trench gate electrode, further balances the stress of each gate trench, prevents the damage to the chip during soldering, and improves the bonding wire yield. In addition, because the curved portion 33 the first bonding wire is elevated, the distance between the first bonding wire and the chip is increased, which is conducive to the full filling of the plastic packaging material when the chip is packaged by plastic, improving the soldering yield of the bonding wire, and improving the overall reliability of the device.

Figure 4:
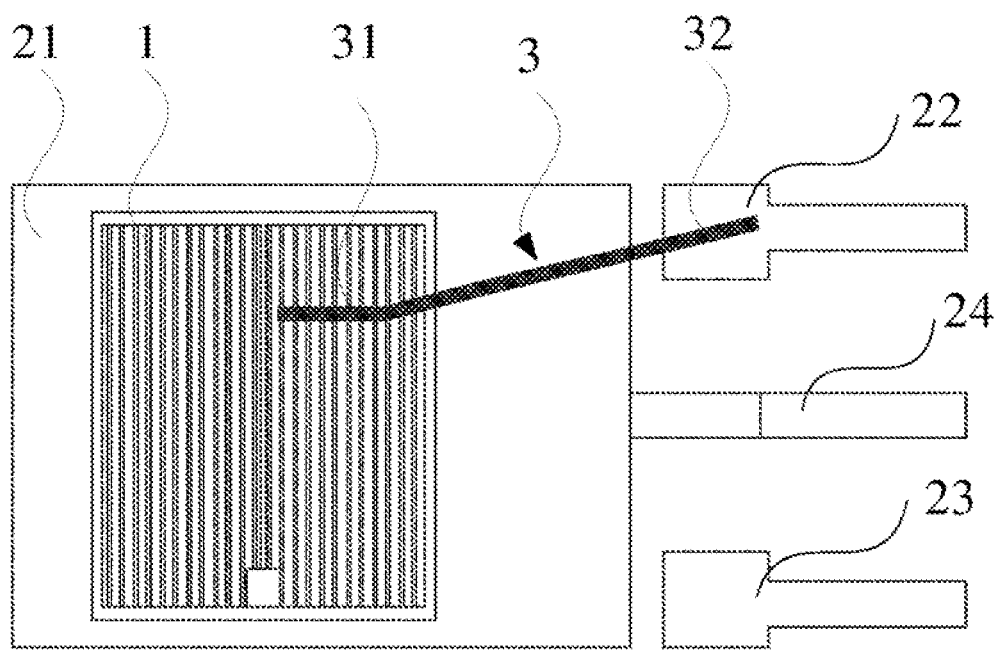
FIG. 4 is a top view of the structure diagram in FIG. 3.

In some embodiments of the disclosure, as shown in FIG. 4, the emitting electrode lead-out end comprises a first wire pad 22 connected with the first bonding wire 3, and the solder joint 32 is formed on the first wire pad 22, which realizes the electrical connection between the emitting electrode metal layer 14 and the emitting electrode lead-out end.

In the embodiments of the disclosure, at least one first bonding wire 3 is connected between the emitting electrode metal layer 14 and the first wire pad 22. For example, if it is needed to solder a first bonding wire 3 of 20 mil, two first bonding wires 3 of 10 mil can be welded on the same wire pad to achieve the same current level. The two first bonding wires 3 can expand the contact area between the first solder joint 31 and the emitting electrode metal layer 14, thus reducing the impact of soldering stress on the chip. In practical applications, the number of the first bonding wires 3 and the number of the first wire pads are selected according to actual situations, and not limited here. For example, there may be one or more than one first wire pad 22. When there are more than one first wire pad 22, multiple first bonding wires are correspondingly connected with multiple first wire pads 22.

In some embodiments of the disclosure, as shown in FIG. 4, the lead frame 2 further includes a gate electrode lead-out end, and the trench gate electrode 12 is electrically connected with the gate electrode lead-out end through a second bonding wire. Specifically, the gate electrode lead-out end comprises a second wire pad for electrical connection with the second bonding wire 23.

In some embodiments of the disclosure, specifically, as shown in FIG. 1, the trench IGBT 1 includes a silicon substrate 11, a trench gate electrode 12 formed on the silicon substrate 11, a silicon oxide insulating layer 13 formed on a surface of one side, away from the silicon substrate 11, of the trench gate electrode 12, and the emitting electrode metal layer 14 formed on one side, away from the silicon substrate 11, of the silicon oxide insulating layer 13.

In some embodiments of the disclosure, the trench IGBT 1 further includes a collecting electrode on one side, far away from the trench gate electrode 12, of the silicon substrate 11, the lead frame 2 further includes a collecting electrode lead-out end 24, and the collecting electrode is electrically and physically connected with the chip placement area 21 of the lead frame 2 by a binding material 4. The collecting electrode lead-out end 24 is connected with the chip placement area 21. Optionally, the binding material 1 may be conductive adhesive to realize electrical connection between the collecting electrode and the lead frame 2. The material of the binding material 4 may also be other materials that can realize the electrical connection and physical connection between the collecting electrode and the chip placement area 21 of the lead frame 2, which is not limited here. The substrate in the IGBT 1 is not limited to the silicon substrate 11, and those skilled in the art may select the substrate according to actual needs.

It should be noted that the design of the position arrangement of the wire pad on the lead frame 2 may be different according to actual productions, and not limited to the structure shown in FIG. 4.

In some embodiments of the disclosure, there is also a fully filled plastic packaging housing which is formed by a plastic packaging process included, which can ensure that there is no cavity inside a plastic packaging device, improve the soldering yield of the bonding wire, and improve the overall reliability of the device.

In some embodiments of the disclosure, the first bonding wire 3 is metal conductors, such as aluminum wire or copper wire, which can save the production cost.

Figure 5:
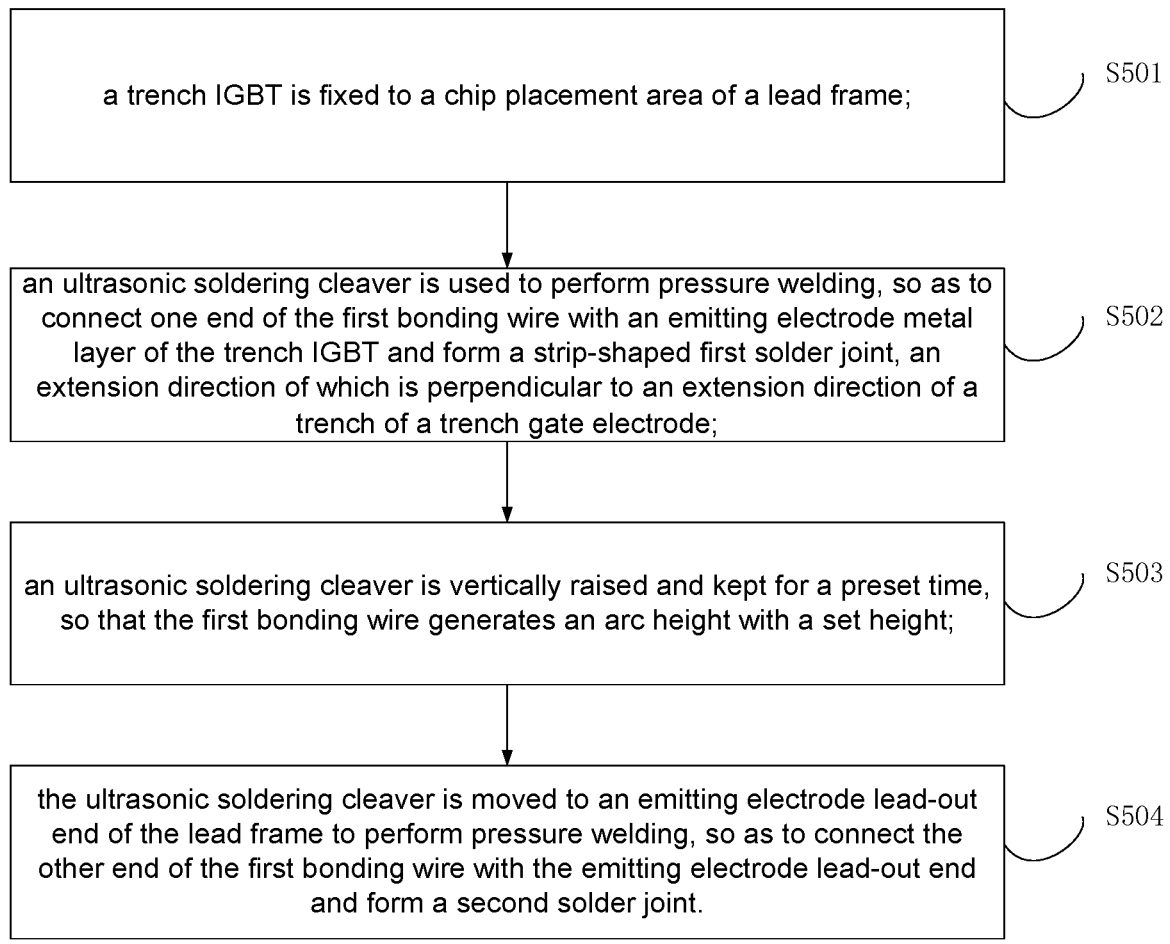
FIG. 5 is a flowchart of a method for manufacturing a trench IGBT packaging structure provided by the embodiments of the disclosure.

The disclosure further provides a method for manufacturing the trench IGBT packaging structure provided in any above embodiment. As shown in FIG. 5, the manufacturing method includes the following steps:

S501, a trench IGBT is fixed to a chip placement area of a lead frame;

At S502, an ultrasonic soldering cleaver is used to perform pressure welding, so as to connect one end of the first bonding wire with an emitting electrode metal layer of the trench IGBT and form a strip-shaped first solder joint, an extension direction of which is perpendicular to an extension direction of a trench of a trench gate electrode;

At S503, an ultrasonic soldering cleaver is vertically raised and kept for a preset time, so that the first bonding wire generates an arc height with a set height;

At S504, the ultrasonic soldering cleaver is moved to an emitting electrode lead-out end of the lead frame to perform pressure welding, so as to connect the other end of the first bonding wire with the emitting electrode lead-out end and form a second solder joint.

In the method for manufacturing the trench IGBT packaging structure provided In some embodiments of the disclosure, the ultrasonic soldering cleaver is configured to perform pressure welding, so as to form the strip-shaped first solder joint perpendicular to the extension direction of the trench of the trench gate electrode, and after the first solder joint is completed, and the ultrasonic soldering cleaver is raised vertically to form the arc height with the set height, the ultrasonic soldering cleaver is moved to the emitting electrode lead-out end of the lead frame to perform pressure welding to form the second solder joint, and then the pressure welding to the first bonding wire is completed. In the method, because the strip-shaped first solder joint is arranged perpendicular to the trench of the trench gate electrode, the first solder joint can press more the trenches of the trench gate electrode, and the more the trenches of the trench gate electrode share the pressure on the first solder joint; in this way, the stress of a single trench is reduced, the damage to the chip during soldering is prevented, the bonding wire yield is improved, and then the reliability of the whole chip is improved.

The principle of the above ultrasonic soldering is as follows: a certain pressure is applied in the vertical direction, and a certain vibration frequency is applied in the plane direction of the chip, so that the emitting electrode metal layer above the chip is combined with the first bonding wire to form the first solder joint.

In some embodiments of the disclosure, to increase the utilization of the time, the preset time can be set to 1 millisecond to 10 milliseconds according to the specific industrial production situation.

In some embodiments of the disclosure, the arc height with the set height of the first bonding wire may be 750 microns to 1000 microns. The arc height in the range is greater than the arc height of the conventional bonding wire, which makes the pressure of the bonding wire evenly distributed in more trenches, further balances the stress of each trench, prevents the damage to the chip during soldering, and improves the bonding wire yield. In addition, because the curved portion 33 the first bonding wire 3 is elevated, as shown in FIG. 3, the distance between the first bonding wire 3 and the chip is increased, which is conducive to the full filling of the plastic packaging material when the chip is packaged by plastic, improving the soldering yield of the bonding wire, and improving the overall reliability of the device.

In some embodiments of the disclosure, after a trench IGBT chip is electrically connected with a corresponding pin on the lead frame, a plastic packaging material is used to fill a combining device of the trench IGBT chip and the lead frame, so as to form a plastic packaging housing an interior of which is fully filled, which ensures that there is no cavity inside the plastic packaging device, improves the soldering yield of the bonding wire, and improves the overall reliability of the device. In some embodiments, the plastic packaging material is filled along a mold flow direction, that is, in the plastic packaging process of a product, the molten plastic packaging material is filled in the product through a plastic injection opening of a plastic packaging mold. In addition, the plastic packaging housing is formed by injecting the plastic packaging material into the gap between the trench IGBT and the lead frame, and wrapping the combining device formed by the trench IGBT and the lead frame.

The corresponding pins on the lead frame above are the emitting electrode lead-out end corresponding to the emitting electrode of the trench IGBT, the gate electrode lead-out end corresponding to the gate electrode of the trench IGBT and the collecting electrode lead-out end corresponding to the collecting electrode of the trench IGBT.

In another embodiment of the disclosure, a method for manufacturing the trench IGBT packaging structure is also provided. The manufactured packaging structure is shown in FIG. 1 to FIG. 3. The method includes the following steps:

a lead frame 2 with a chip placement area 21 is provided, and a trench IGBT 1 is fixed to the chip placement area 21, the trench IGBT 1 includes an emitting electrode, an emitting electrode metal layer 14 electrically connected with the emitting electrode and the trench gate electrode 12 arranged on one side of the emitting electrode metal layer 14, and the trench gate electrode 12 comprises an extending trench;

one end of a first bonding wire 3 is soldered with the emitting electrode metal layer 14, so as to form a strip-shaped first solder joint 31 on a surface, away from the trench gate electrode 12, of the emitting electrode metal layer 14, an extension direction of the first solder joint 31 is perpendicular to an extension direction of the trench of the trench gate electrode 12;

the other end of the first bonding wire 3 is soldered with an emitting electrode lead-out end to form a second solder joint 32.

In the method for manufacturing the trench IGBT packaging structure provided in the embodiments of the disclosure, one end of the first bonding wire is soldered with the emitting electrode metal layer to form the strip-shaped first solder joint perpendicular to the extension direction of the trench of the trench gate electrode, and the other end of the first bonding wire is soldered with the emitting electrode lead-out end to form the second solder joint. In the method, because the strip-shaped first solder joint is arranged perpendicular to the trench of the trench gate electrode, the first solder joint can press more the trenches of the trench gate electrode, and the more the trenches of the trench gate electrode share the pressure on the first solder joint; in this way, the stress of a single trench is reduced, the damage to the chip during soldering is prevented, the bonding wire yield is improved, and then the reliability of the whole chip is improved.

In some embodiments of the disclosure, either of fusion welding, pressure welding, or brazing may be used to realize the connection of the first bonding wire to the emitting electrode metal layer and the emitting electrode lead-out end. In order to better form the strip-shaped first solder joint 31, in some embodiments, the ultrasonic soldering cleaver is used to perform pressure welding to one end of the first bonding wire 3 and the emitting electrode metal layer 14.

In some embodiments of the disclosure, after the first solder joint 31 is formed, the ultrasonic soldering cleaver is vertically raised and kept for a preset time, so that the first bonding wire 3 generates an arc height with a set height. To improve time utilization of the time, in some embodiments, the preset time is 1 millisecond to 10 milliseconds.

In some embodiments, the arc height with the set height of the first bonding wire is 750 microns to 1000 microns. The arc height in the range is greater than the arc height of the conventional bonding wire, which makes the pressure of the bonding wire evenly distributed in more trenches, further balances the stress of each trench, prevents the damage to the chip during soldering, and improves the bonding wire yield. In addition, because the curved portion 33 the first bonding wire 3 is elevated, the distance between the first bonding wire 3 and the chip is increased, which is conducive to the full filling of the plastic packaging material when the chip is packaged by plastic, improving the soldering yield of the bonding wire, and improving the overall reliability of the device.

In some embodiments of the disclosure, the lead frame 2 further includes a gate electrode lead-out end. The method further includes that: the trench gate electrode 12 is electrically connected with the gate electrode lead-out end by the second bonding wire.

In some embodiments of the disclosure, as shown in FIG. 1, the trench IGBT 1 further includes a substrate and an insulating layer. The trench gate electrode 12 is formed on the substrate, the insulating layer is formed on one side, away from the substrate, of the trench gate electrode 12, and the emitting electrode metal layer 14 is formed on one side, away from the substrate, of the insulating layer. In some embodiments, the substrate is the silicon substrate 11, and the insulating layer is the silicon oxide insulating layer 13.

In some embodiments of the disclosure, as shown in FIG. 4, the trench IGBT further includes a collecting electrode on one side, far away from the trench gate electrode 12, of the silicon substrate, and the lead frame further includes a collecting electrode lead-out end 24. The collecting electrode is electrically and physically connected with the chip placement area 21 of the lead frame 2 by binding material 4, and the collecting electrode lead-out end 24 is connected with the chip placement area 21.

In some embodiments of the disclosure, the trench IGBT 1 and the lead frame 2 form a combining device, and after the trench IGBT 1 is connected with the emitting electrode lead-out end, the gate electrode lead-out end and the collecting electrode lead-out end 24, the combining device is filled with the plastic packaging material, so as to form a plastic packaging housing an interior of which is fully filled.

It is apparent that those skilled in the art can make various modifications and variations to the disclosure without departing from the spirit and scope of the disclosure. Thus, if such modifications and variations of the disclosure fall within the scope of the appended claims and their equivalents, the disclosure is also intended to cover the modifications and variations.

The above is only the preferred embodiments of the disclosure and not intended to limit the disclosure; for those skilled in the art, the disclosure may have various modifications and changes. Any modifications, equivalent replacements, improvements and the like within the spirit and principle of the disclosure should fall within the protection scope of the claims of the disclosure.

What is claimed is:

1. A trench Insulated Gate Bipolar Transistor (IGBT) packaging structure, comprising:

a trench IGBT, which comprises an emitting electrode, an emitting electrode metal layer electrically connected to the emitting electrode, and a trench gate electrode arranged on one side of the emitting electrode metal layer;

a lead frame, which comprises an emitting electrode lead-out end and a chip placement area configured to fix the trench IGBT; and a first bonding wire connecting the emitting electrode metal layer and the emitting electrode lead-out end; wherein one end of the first bonding wire is connected to a surface, away from the trench gate electrode, of the emitting electrode metal layer to form a strip-shaped first solder joint, the other end of the first bonding wire is connected to the emitting electrode lead-out end to form a second solder joint, and an extension direction of the first solder joint is perpendicular to an extension direction of a trench of the trench gate electrode, wherein a part, between the first solder joint and the second solder joint, of the first bonding wire forms a curved portion, and an arc height from a highest point of the curved portion to the emitting electrode metal layer is 750 microns to 1000 microns, the extension direction of the first solder joint is a length direction of the first solder joint, the extension direction of the trench is an extending direction of a length of the trench, and the extension direction of the trench is perpendicular to a depth direction of the groove direction.

2. The trench IGBT packaging structure as claimed in claim 1, wherein the emitting electrode lead-out end comprises a first wire pad which is connected with the first bonding wire, and the second solder joint is formed on the first wire pad.

3. The trench IGBT packaging structure as claimed in claim 2, wherein at least one first bonding wire is connected between the emitting electrode metal layer and the first wire pad.

4. The trench IGBT packaging structure as claimed in claim 1, wherein the lead frame further comprises a gate electrode lead-out end, and the trench gate electrode is electrically connected with the gate electrode lead-out end through a second bonding wire.

5. The trench IGBT packaging structure as claimed in claim 1, wherein the trench IGBT comprises a silicon substrate, the trench gate electrode formed on the silicon substrate, a silicon oxide insulating layer formed on a surface of one side, away from the silicon substrate, of the trench gate electrode, and the emitting electrode metal layer formed on one side, away from the silicon substrate, of the silicon oxide insulating layer.

6. The trench IGBT packaging structure as claimed in claim 5, wherein the trench IGBT further comprises a collecting electrode on one side, far away from the trench gate electrode, of the silicon substrate, the lead frame further comprises a collecting electrode lead-out end, and the collecting electrode is electrically and physically connected with the chip placement area of the lead frame by a binding material.

7. The trench IGBT packaging structure as claimed in claim 1, wherein the trench IGBT further comprises a plastic packaging housing, the plastic packaging housing is formed by a plastic packaging process, and an interior of the plastic packaging housing is fully filled.

8. The trench IGBT packaging structure as claimed in claim 1, wherein the trench IGBT comprises a substrate, the trench gate electrode, a silicon oxide insulating layer and the emitting electrode metal layer, the trench gate electrode is formed on the substrate, the silicon oxide insulating layer is formed on one side, away from the substrate, of the trench gate electrode, and the emitting electrode metal layer is formed on one side, away from the substrate, of the silicon oxide insulating layer.

9. The trench IGBT packaging structure as claimed in claim 6, wherein the collecting electrode lead-out end is connected with the chip placement area.

10. The method as claimed in claim 1, wherein the trench IGBT further comprises a substrate and an insulating layer, the trench gate electrode is formed on the substrate, the insulating layer is formed on one side, away from the substrate, of the trench gate electrode, and the emitting electrode metal layer is formed on one side, away from the substrate, of the insulating layer.

* * * * *